(12) United States Patent
Mollard et al.

(10) Patent No.: US 8,377,212 B2
(45) Date of Patent: Feb. 19, 2013

(54) CHAMBER, DEVICE AND METHOD FOR ANNEALING A SEMI-CONDUCTOR MATERIAL OF II-VI TYPE

(75) Inventors: Laurent Mollard, Grenoble (FR); Guillaume Bourgeois, Grenoble (FR); Franck Henry, Meylan (FR); Bernard Pelliciari, Saint Egreve (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 378 days.

(21) Appl. No.: 12/788,650

(22) Filed: May 27, 2010

(65) Prior Publication Data

US 2010/0304576 A1 Dec. 2, 2010

(30) Foreign Application Priority Data

May 27, 2009 (FR) ...................................... 09 02560

(51) Int. Cl.
*C23C 16/00* (2006.01)
*C23C 16/455* (2006.01)
*C23C 16/448* (2006.01)
*C23C 16/46* (2006.01)

(52) U.S. Cl. .................. 118/725; 118/715; 118/723 VE; 118/724; 118/726

(58) Field of Classification Search ............... 118/715, 118/723 VE, 724, 726, 725
See application file for complete search history.

(56) References Cited

U.S. PATENT DOCUMENTS

| 3,723,190 | A | | 3/1973 | Kruse et al. |
| 4,028,145 | A | * | 6/1977 | Kasenga ....................... 438/796 |
| 4,439,267 | A | | 3/1984 | Jackson, Jr. |
| 4,566,918 | A | | 1/1986 | Irvine et al. |
| 5,079,610 | A | * | 1/1992 | Norton .......................... 257/442 |
| 5,182,217 | A | * | 1/1993 | Norton ............................ 438/68 |
| 5,425,812 | A | * | 6/1995 | Tsutahara et al. ............ 118/725 |
| 2010/0304576 | A1 | * | 12/2010 | Mollard et al. ............... 438/796 |

FOREIGN PATENT DOCUMENTS

| DE | 102011012548 A1 * | 8/2012 |
| EP | 0 135 344 A1 | 3/1985 |
| GB | 2 156 857 A | 10/1985 |
| JP | A-9-326404 | 12/1997 |
| WO | WO 2012007047 A1 * | 7/2012 |

OTHER PUBLICATIONS

Destefanis, "Electrical Doping of HgCdTe by Ion Implantation and Heat Treatment," *Journal of Crystal Growth*, 1988, pp. 700-722, vol. 86, North-Holland Physics Publishing, North-Holland, Amsterdam.

* cited by examiner

*Primary Examiner* — Jeffrie R Lund
(74) *Attorney, Agent, or Firm* — Oliff & Berridge, PLC

(57) ABSTRACT

A chamber for annealing a semi-conductor material of II-VI type having a first area for storing an element of group II of the periodic table and a second area designed to receive the semi-conductor material of II-VI type. The chamber s equipped with a separating partition at the level of an intermediate area. This separating partition is provided with a passage aperture equipped with gas anti-reverse flow means to ensure one-way passage of the element of group II of the periodic table, in vapor phase, from the first area to the second area. This chamber is heated by heating means enabling the two areas to be heated independently.

11 Claims, 5 Drawing Sheets

CHAMBER, DEVICE AND METHOD FOR ANNEALING A SEMI-CONDUCTOR MATERIAL OF II-VI TYPE

BACKGROUND OF THE INVENTION

The invention relates to a chamber for annealing a semi-conductor material of II-VI type having a first storage area an element of group II of the periodic table and a second area designed to receive the semi-conductor material of II-VI type.

The invention also relates to a device for annealing a semi-conductor material of II-VI type comprising one such chamber and a method for annealing a semi-conductor material of II-VI type in the presence of an element of group II of the periodic table using one such device.

STATE OF THE ART

Extrinsic p-type or n-type semi-conductor materials serve the purpose in particular of creating p-n or n-p junctions or n-p-n or p-n-p double junctions of semi-conductor devices, for example diodes or bipolar transistors. These p-type or n-type semi-conductors are conventionally obtained by various doping methods. In particular, heat treatment or annealing is performed to diffuse an element of group II of the periodic table into the crystal lattice of a semi-conductor material of II-VI type to correct crystal lattice defects of the semi-conductor material of II-VI type and in particular to improve its optoelectric characteristics.

N-type single-crystal compounds, such as single crystals of mercury cadmium telluride (HgCdTe or MerCaTel, hereinafter designated by the acronym MCT) are particularly well-suited for use as intrinsic infrared detectors. They are obtained by controlling the type of conductivity of semi-conductor materials of II-VI type by adjusting the density of the extrinsic charge carriers. The conductivity characteristics of the MCT crystal can then conventionally be adjusted by annealing under dry mercury (Hg) pressure. The interstitial mercury atoms act as donors and the mercury vacancies act as acceptors. Annealing induces filling of the MCT crystal vacancies which are then filled by mercury atoms to form an n-type HgCdTe crystal presenting better optoelectric characteristics than the p-type crystal.

The document JP-A-9326404 describes heat treatment of MCT wafers in the presence of mercury to improve the crystalline characteristics of MCT. As represented in FIG. 1, a MCT wafer 1 and liquid mercury 2 are placed in a sealed ampoule 3. Ampoule 3 is then subjected to a predefined, uniform and constant annealing temperature generated by heating means 4 arranged around ampoule 3. Liquid mercury 2 is arranged in the bottom part of ampoule 3, i.e. opposite MCT wafer 1. It is vaporized and mercury in vapor phase 5 is applied to MCT wafer 1. The annealing temperature is maintained during a predefined anneal time until vacancies of the crystal lattice of MCT wafer 1 are filled by mercury in vapor phase 5. The quantity of liquid mercury 2 input to ampoule 3 is calculated very precisely to correspond to the desired charge carrier density.

G. L. Destefanis demonstrates in the article "Electrical Doping Of HgCdTe by Ion Implantation and Heat Treatment" (Journal of Crystal Growth, 1988, n° 86, P.700-722) that the charge carrier density of a single crystal of MerCaTel in fact depends on the annealing temperature ($T_r$) and on the partial pressure of the mercury vapor ($P_{Hg}$). The phase equilibrium diagram represented in FIG. 2 defines the equilibrium domains of a single crystal of MerCaTel of formula $Hg_{0.8}Cd_{0.2}Te$ when annealing is performed under dry mercury (Hg) pressure. The article highlights the relation between n-type or p-type charge carrier density, annealing temperature ($T_r$) and annealing pressure ($P_r$) corresponding to the partial pressure of the Hg vapor at equilibrium in ampoule 3. The $T_r/P_r$ pair consequently conditions doping of the $Hg_{0.8}Cd_{0.2}Te$ single crystal with the existence of internal equilibriums along lines L at constant density. Adjustment of parameters $P_r$ and $T_r$ therefore enables a desired doping rate to be obtained corresponding to a specific charge carrier density in the MCT single-crystal. Any variation of $P_r$ and/or $T_r$ leads to a variation of the doping rate of the $Hg_{0.8}Cd_{0.2}Te$ single crystal.

The quantity of liquid mercury 2 to be input to ampoule 3 is calculated from the following equation (1) of perfect gases which is applied at equilibrium:

$$P_r V = n_r R T_r \quad (1)$$

in which:
- $P_r$ is the annealing pressure (in Pa);
- V is the volume of ampoule 3 occupied by mercury in vapor phase 5 (in m$^3$);
- $n_r$ is the number of moles of liquid mercury 2 input to ampoule 3 (in moles);
- R is the universal constant of perfect gases R=8.314472 J.K$^{-1}$.mol$^{-1}$;
- Tr is the annealing temperature (in K).

The number of moles $n_r$ of liquid mercury 2 input to ampoule 3 necessary to fill the vacancies of the $Hg_{0.8}Cd_{0.2}Te$ single crystal and to obtain a given charge carrier density is in accordance with the following equation (2):

$$n_r = (P_r V)/(R T_r) \quad (2)$$

Knowing the molar mass ρ of mercury (200.59 g.mol$^{-1}$), the mass of liquid mercury 2 to be input to ampoule 3 can be deduced from the following equation (3):

$$m = \rho \times (P_r V)/(R T_r) \quad (3)$$

For example purposes, to obtain a $Hg_{0.8}Cd_{0.2}Te$ single crystal with a charge carrier density of $10^{17}$ at.cm$^{-3}$, during an anneal performed at an annealing temperature $T_r$ of 400° C. (673.15 K), the pressure $P_r$ will be $10^{-1}$ atm (1.01325*10$^4$ Pa) according to the phase equilibrium diagram of FIG. 2.

From equation (1), the number of mercury moles corresponding to the ($P_r$, $T_r$) pair at thermodynamic equilibrium is then calculated, i.e. $n_r = 1.44 \times 10^{-3}$ mole for an annealing pressure $P_r = 1.01325 \times 10^4$ Pa ($10^{-1}$ atm) and an annealing temperature $T_r = 673.15$ K (400° C.).

Knowing the molar mass of mercury (200.59 g.mol$^{-1}$) and for a volume of ampoule 3 corresponding to $8 \times 10^{-4}$ m$^3$, the quantity of liquid mercury 2 necessary for a charge carrier density of $10^{17}$ at.cm$^{-3}$ is deduced therefrom, i.e. 289 mg of Hg.

The quantity of liquid mercury 2 to be input to ampoule 3 is then weighed exactly before being input to ampoule 3. Ampoule 3 is then sealed.

Nevertheless, weighing of liquid mercury 2 is often subject to errors with uncertainties on the mass of up to several percent of the mass. These uncertainties make the annealing pressure $P_r$, and consequently the doping rate, vary significantly. Doping from such a device is hardly reproducible and lacks precision. Furthermore, the pressure difference between the actual pressure obtained in ampoule 3 and the theoretical pressure is only observed once the thermodynamic equilibrium has been reached. This error can then only be corrected by breaking ampoule 3 and repeating the weighing operation, sealing ampoule 3 and annealing to obtain the required annealing pressure $P_r$.

Weighing of liquid mercury 2 before loading into ampoule 3 is furthermore often a source of contamination. Precise weighing of liquid mercury 2 requires several handling operations, conventionally with a syringe and a spatula, to adjust the weighing. These successive handling operations can induce counter-doping or unwanted doping of MCT wafer 1.

Other known methods propose annealing in the presence of an excess of mercury. The document U.S. Pat. No. 3,723,190 in particular describes a method for preparing n-type MCT with the formula $Hg_{1-x}Cd_xTe$ (with $0<x<1$) from a p-type $Hg_{1-x}Cd_xTe$ material subjected to a temperature gradient. Heat treatment comprises a first treatment at a lower temperature than the solidus temperature of MCT to obtain a homogeneous material followed by a second treatment in the presence of an excess of mercury to adjust the stoichiometry of the material and consequently the type of conductivity. The second heat treatment reduces the free electron concentration in the n-type material or converts the p-type material into n-type. Nevertheless, the excess mercury present throughout the second heat treatment fixes a part of the elements constituting the MCT wafer and results in dissolution or precipitation of these elements via the gaseous phase of mercury. This secondary effect affects the doping quality.

OBJECT OF THE INVENTION

The object of the invention is to provide a chamber for annealing a semi-conductor material of II-VI type remedying the shortcomings of the prior art. In particular, the object of the invention is to propose a chamber enabling doping of semi-conductor material of II-VI type to be performed in precise, reproducible and dependable manner, while at the same time reducing the risks of contamination.

It is a further object of the invention to provide a device for annealing a semi-conductor material of II-VI type comprising this chamber as well as to provide an annealing method in the presence of an element of group II of the periodic table using one such device.

According to the invention, this object is achieved by a chamber, an annealing device and an annealing method according to the appended claims.

BRIEF DESCRIPTION OF THE DRAWINGS

Other advantages and features will become more clearly apparent from the following description of particular embodiments of the invention, given for non-restrictive example purposes only and represented in the accompanying drawings in which.

DESCRIPTION OF PARTICULAR EMBODIMENTS OF THE INVENTION

Figure 3:
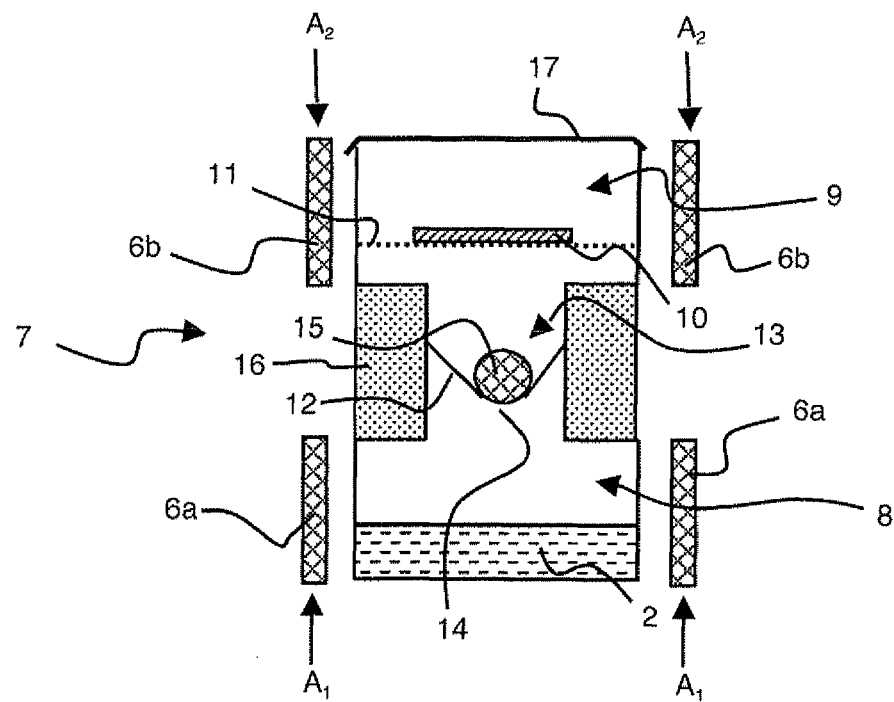
FIG. 3 schematically represents a cross-section of a particular embodiment of a device for annealing a semi-conductor material of II-VI type according to the invention.

As illustrated in FIG. 3, the device for annealing a semi-conductor material of II-VI type in the presence of an element of group II of the periodic table comprises a chamber 7 for annealing the semi-conductor material of II-VI type, heating means 6a and 6b and means for controlling the heating temperature. Chamber 7 is particularly suited to annealing mercury cadmium telluride (HgCdTe) as semi-conductor material of II-VI type.

Mercury cadmium telluride is a compound of general formula $Hg_{1-x}Cd_xTe$ where x is strictly comprised between 0 and 1 ($0<x<1$).

The element of group II of the periodic table is advantageously mercury. Mercury presents the advantage of having a very low partial vapor pressure compared with the other elements of group II of the periodic table.

Other semi-conductors such as CdTe, GaAs, GaP or InP having a doping adjustable by annealing under vapor pressure of one of their elements can also be used.

According to a particular embodiment, the semi-conductor material of II-VI type is mercury cadmium telluride and the element of group II of the periodic table is liquid mercury 2 at ambient temperature.

As represented in FIG. 3, chamber 7 has a first storage area 8 of liquid mercury 2 and a second area 9 designed to receive MCI. The latter is conventionally in the form of a MCT wafer 10. A grate 11 fixed to the inside walls of chamber 7 supports MCT wafer 10, while at the same time exposing the maximum surface of the MCT.

Chamber 7 further comprises a separating partition 12 at the level of an intermediate area 13. Separating partition 12 is provided with a passage aperture 14 equipped with a gas anti-reverse flow device 15 to ensure one-way flow of the mercury in vapor phase 5 from first area 8 to second area 9.

Separating partition 12 delineates volumes $V_1$ and $V_2$ respectively corresponding to first area 8 and to second area 9.

Gas anti-reverse flow device 15 can be formed by a check valve, preferably a ball check valve (FIG. 3).

According to an alternative embodiment, gas anti-reverse flow device 15 can be formed by a mechanical system, opening and closing whereof is triggered manually.

Chamber 7 advantageously has a reduced internal cross-section at the level of intermediate area 13. Chamber 7 is preferably made from quartz, for example a quartz ampoule, presenting a narrowing at the level of intermediate area 13. This structural characteristic enables heat exchanges between the first and second areas, respectively 8 and 9, to be reduced. The wall of chamber 7 preferably comprises a thermal insulation 16 at the level of intermediate area 13. First and second areas 8 and 9 are thus thermally insulated from one another. The whole circumference of chamber 7 can for example be surrounded at the level of intermediate area 13 by rock-wool forming thermal insulation 16.

Chamber 7 advantageously comprises a plugging and sealing member 17 (at the top part in FIG. 3) that performs tight closing of chamber 7. Chamber 7 can thus be subjected to a reduced pressure, after liquid mercury 2 has been loaded in first area 8 by creating a vacuum in chamber 7, before chamber 7 is closed by sealing the plugging and sealing member 17.

Volume $V_2$ of second area 9 is thus delineated at the top part thereof by plugging and sealing member 17, by the side walls of chamber 7 and, at the bottom part thereof, by separating partition 12 and ball check valve 15.

The device for annealing a MCT wafer 10 in the presence of liquid mercury 2 comprises chamber 7, heating means 6a and 6b, and control means, not represented, enabling the heating temperature of first area 8 and of second area 9 to be controlled independently from one another.

Several MCT wafers 10 can be placed in second area 9 side by side or on top of one another on grates 11 spaced apart from one another.

The heating means (6a and 6b in FIG. 3) enable the first and second area, respectively 8 and 9, to be heated independently and to be kept at identical or different temperatures.

For example purposes, control signals $A_1$ control heating means 6a of first area 8, whereas control signals $A_2$ control heating means 6b of second area 9 independently.

According to a particular embodiment represented in FIG. 3, heating means 6a and 6b can be formed by at least two heating means respectively covering first and second area 8 and 9. Each heating means advantageously surrounds the whole circumference of chamber 7 around the corresponding area so as to obtain a homogeneous temperature. The heating means 6a and 6b are arranged in such a way that a constant and uniform temperature can be obtained in each of areas 8 and 9 and in intermediate area 13. The presence of cold spots has to be avoided to prevent any condensation within chamber 7.

Temperature regulation of the heating means 6a and 6b by control means also enables temperature gradients in chamber 7 to be mastered by heating first area 8 and second area 9 simultaneously and/or consecutively.

Furthermore, thermal insulation 16 minimizing heat exchanges between first area 8 and second area 9 improves control of heating and/or cooling of first and second areas, respectively 8 and 9.

In a preferred embodiment, heating means 6a and 6b and the control means of the heating temperature of first area 8 and second area 9 independently from one another are advantageously formed by a two-zone furnace.

Doping of a semi-conductor material 10 of II-VI type in the presence of an element 2 of group II of the periodic table is performed by means of an annealing method using the annealing device described above.

According to a particular embodiment represented in FIGS. 4 to 8, the method comprises a first step of loading liquid mercury 2 at ambient temperature into first area 8 of the annealing device. During this step, plugging and sealing member 17 is released from chamber 7 to allow access to first area 8.

To avoid problems of contamination and the necessity of weighing liquid mercury 2 constituting the doping element, an excess of liquid mercury 2 is used to supply chamber 7 with doping element. The excess takes account of the quantity of mercury 2 calculated from equation (3) above, a quantity necessary for obtaining a determined doping rate of a MCT wafer 10. The doping rate corresponds to a number of mercury moles $n_r$ in vapor phase 5 in a defined volume $V_2$ of second area 9. Thus, for a volume $V_2$ of $8*10^{-4}$ m$^3$, a number of moles $n_r$ equal to $1.44*10^{-3}$ mole, and a ($T_r$, $P_r$) pair corresponding respectively to 400° C. and $10^{-1}$ atm, the quantity of liquid mercury 2 necessary to obtain a doping rate of $10^{17}$ at.cm$^{-3}$ is 289 mg of mercury.

Practically, pre-dosed ampoules for conditioning liquid mercury 2, sold on the market, can be used. The conditioning ampoules should then be chosen to enable an excess quantity of liquid mercury 2, i.e. more than 300 mg and preferably much more than this value, to be input to first area 8 of ampoule 7. For example purposes, 500 mg to 5000 mg of liquid mercury 2 can be input. Liquid mercury 2 is advantageously transferred from its initial conditioning ampoule to first area 8 of chamber 7. This transfer is performed without any handling or any contact whatsoever with objects that are able to be a source of contamination of liquid mercury 2.

Figure 4:
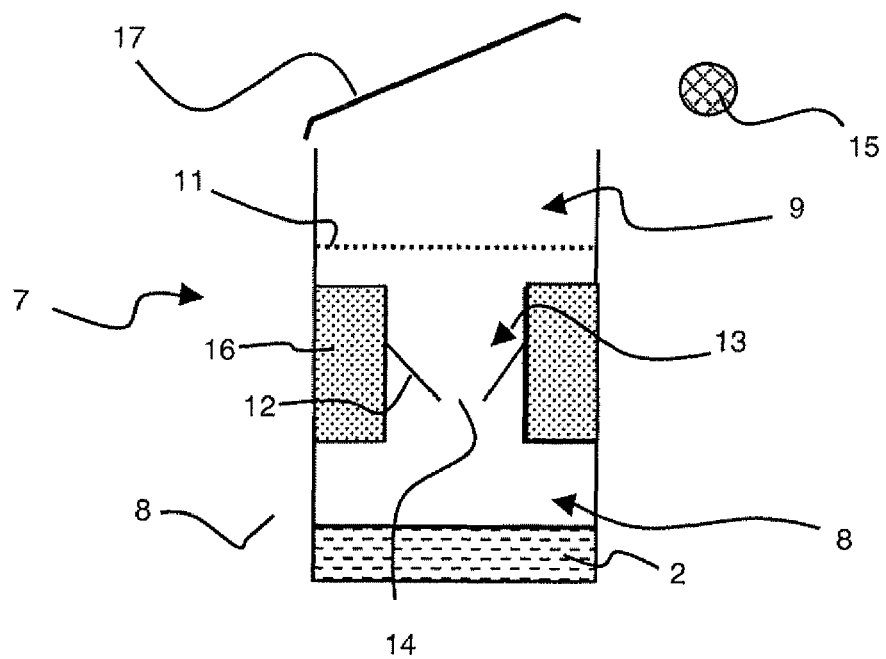
FIGS. 4 to 8 schematically represent cross-sections of the different steps of a method for annealing a semi-conductor material of II-VI type in the presence of an element of group II of the periodic table using the annealing device according to FIG. 3.

When gas anti-reverse flow device 15 is a ball check valve, loading of liquid mercury 2 is performed once ball check valve 15 has been removed from its housing to release passage aperture 14 (FIG. 4).

Figure 5:
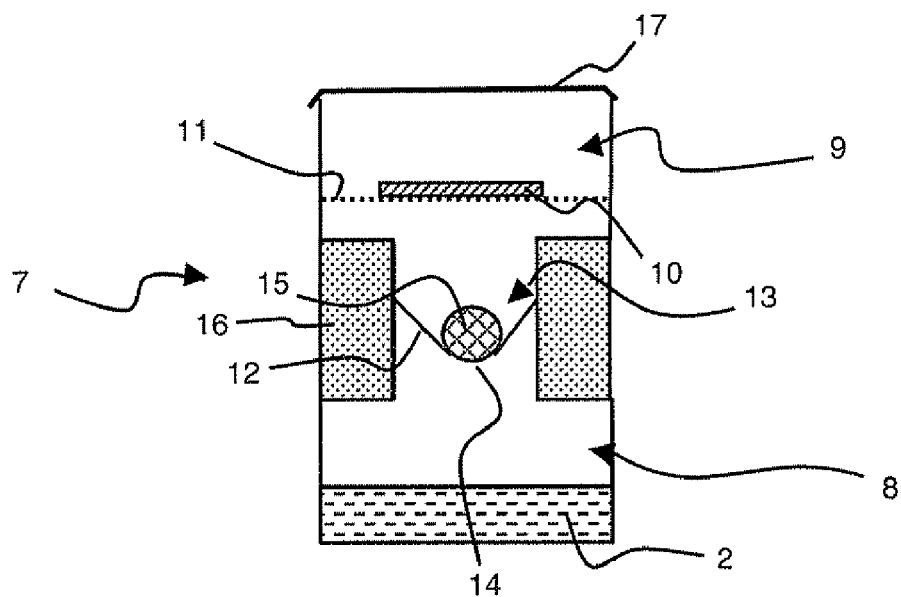

As represented in FIG. 5, ball check valve 15 is then placed back in its housing to seal off passage aperture 14. MCT wafer 10 is arranged on grate 11 and a vacuum is created in chamber 7 so as to apply a pressure close to zero in chamber 7. The vacuum is created by any known method. For example, chamber 7 can be placed in a vacuum chamber (not represented).

According to an alternative embodiment that is not represented, prior to the vacuum being created, chamber 7 is cooled with liquid nitrogen to freeze the mercury during the pumping step.

Plugging and/or sealing member 17 is then repositioned so as to make chamber 7 hermetic, for example by sealing.

The heating means are controlled manually or by automatic programming by the heating temperature control means of first area 8 and of second area 9, independently from one another.

Figure 6:
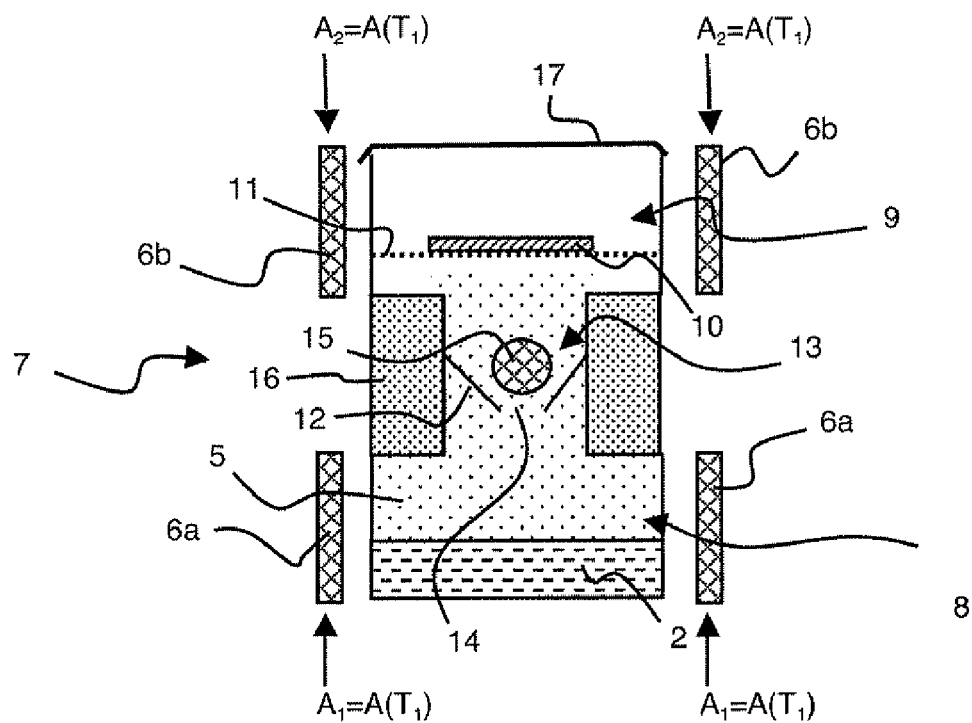

First area 8 and second area 9 are then heated to the same predetermined temperature $T_1$, either simultaneously or successively to make the mercury in vapor phase 5 go from first area 8 to second area 9 (FIG. 6). This can be obtained by applying identical signals $A_1=A_2=A(T_1)$ to heating means 6a and 6b if volumes $V_1$ and $V_2$ are equal.

Temperature $T_1$ is calculated in order to obtain a determined number of mercury moles $n_r$ in second area 9. This number of moles $n_r$ refers to the doping rate with mercury in vapor phase 5 of a MCT wafer 10 having a known stoichiometry, at a given volume. The number of moles $n_r$ corresponds to a desired charge carrier density for the ($T_r$, $P_r$) pair determined according to the diagram represented in FIG. 2. For example purposes, the ($T_r$, $P_r$) pair is selected equal to (400° C., $10^{-1}$ atm) for a charge carrier density of $10^{17}$ at.cm$^{-3}$.

Figure 9:
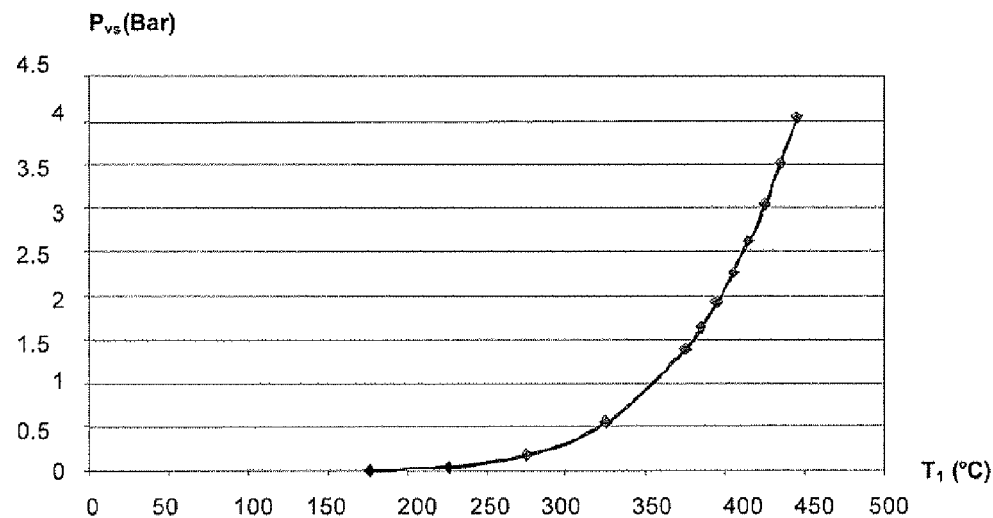
FIG. 9 represents the liquid/vapor phase diagram of mercury.

Temperature $T_1$ is determined from the known mercury liquid/vapor phase change diagram represented in FIG. 9 (Clapeyron's law). At thermodynamic equilibrium, mercury in vapor phase 5 is in equilibrium with liquid mercury 2 and partial mercury vapor pressure $P_v$ corresponds to saturating vapor pressure $P_{vs}$ of mercury.

Figure 10:
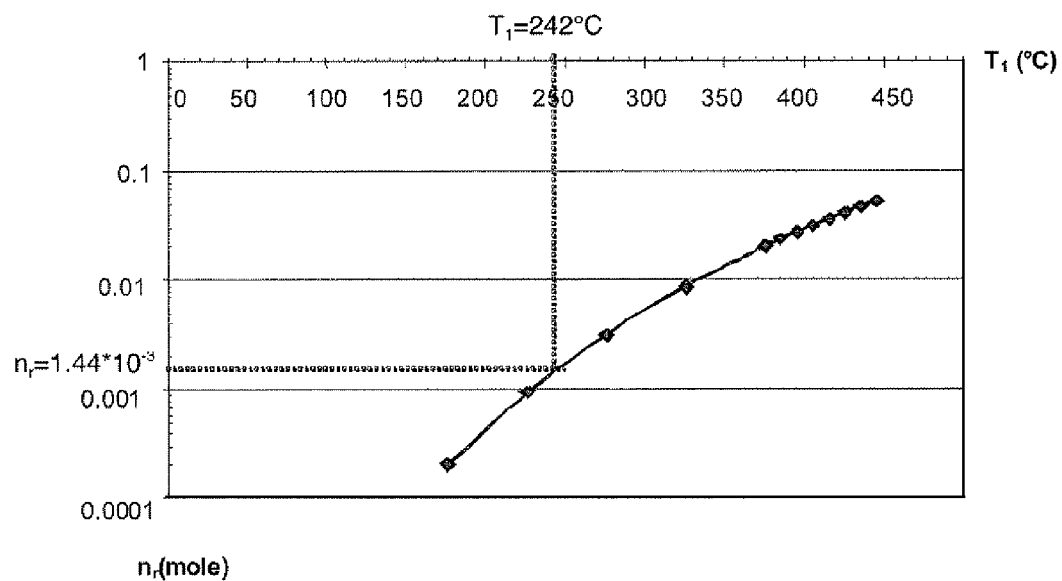
FIG. 10 represents the progression of the number of mercury moles in vapor phase versus the temperature, at thermodynamic equilibrium, in a chamber having a volume $V_2=8*10^{-4} m^3$.

By applying equation (2), for a given volume $V_2$, for example $8*10^{-4}$ m$^3$ and from the known phase diagram represented in FIG. 9, the progression curve of the number of mercury moles present in the vapor, at thermodynamic equilibrium, can be plotted versus temperature (FIG. 10). The number of mercury moles $n_r$ in vapor phase 5 present in second area 9 is therefore totally controlled by temperature $T_1$.

For example purposes, for the ($T_r$, $P_r$) pair corresponding respectively to 400° C. and $10^{-1}$ atm (FIG. 2), the number of moles $n_r$ calculated according to equation (2) and for the previously defined volume is $1.44*10^{-3}$ mole.

By transferring this value $n_r$ to the curve plot of the diagram of FIG. 10, a temperature $T_1$ of 242° C. is determined. This temperature of 242° C. corresponds to the temperature to which chamber 7, and more particularly first area 8 and second area 9, has to be subjected for the partial mercury vapor pressure $P_v$, at thermodynamic equilibrium, to be equal to the saturating vapor pressure $P_{vs}$. At a temperature $T_1$ equal to 242° C., the number of mercury moles $n_r$ in vapor phase 5 is equal to $1.44*10^{-3}$ moles for a volume $V_2$ of second area 9 of $8*10^{-4}$ m$^3$.

As represented in FIG. 6, mercury in vapor phase 5 emitted in first area 8 raises ball check valve 15 and enters second area 9. Heating of the first and second area to the same temperature $T_1$ makes mercury in vapor phase 5 go from first area 8 to second area 9 until partial mercury vapor pressure $P_v$ in the whole of chamber 7 reaches a value corresponding to saturating vapor pressure $P_{vs}$ of mercury for a desired doping rate. The temperature is advantageously homogeneous to avoid the presence of cold spots, in particular in intermediate area 13.

The heating means being a furnace, chamber 7 can if required be moved into the furnace, during heating, to prevent formation of cold spots located in chamber 7 resulting in condensation of mercury.

Figure 7:
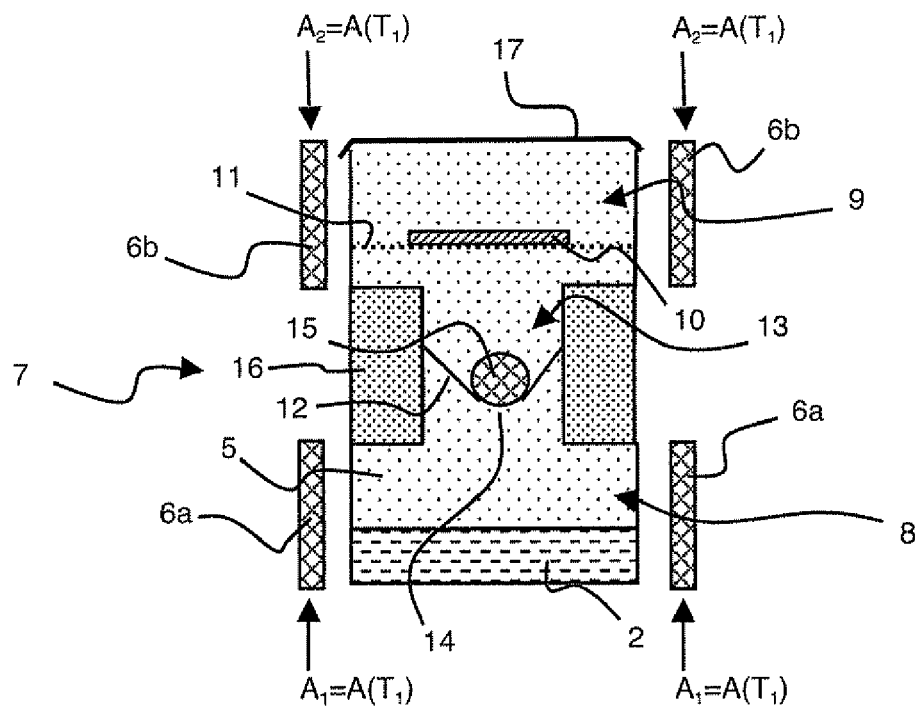

As represented in FIG. 7, at thermodynamic equilibrium, mercury in vapor phase 5 is in equilibrium with excess liquid mercury 2 and fills the whole of chamber 7. The pressure in chamber 7 is then equal to the saturating vapor pressure $P_{vs}$ of mercury. The pressure is homogeneous in the first and second areas, respectively 8 and 9. Ball check valve 15 consequently falls back into its housing sealing off passage aperture 14.

Figure 1:
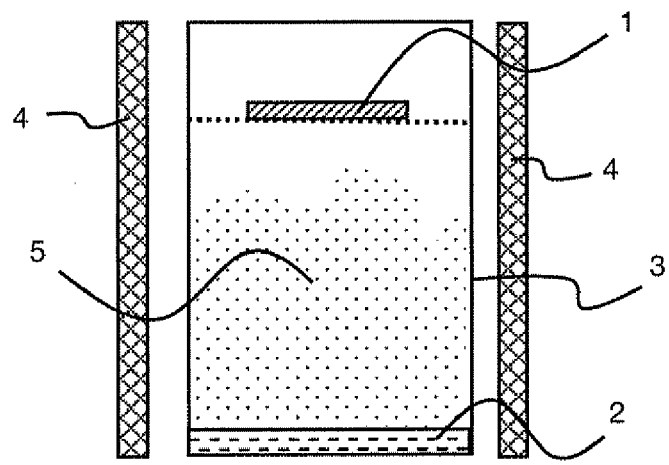
FIG. 1 schematically represents a cross-section of a device for annealing semi-conductor materials of type II-VI according to the prior art.
Figure 2:
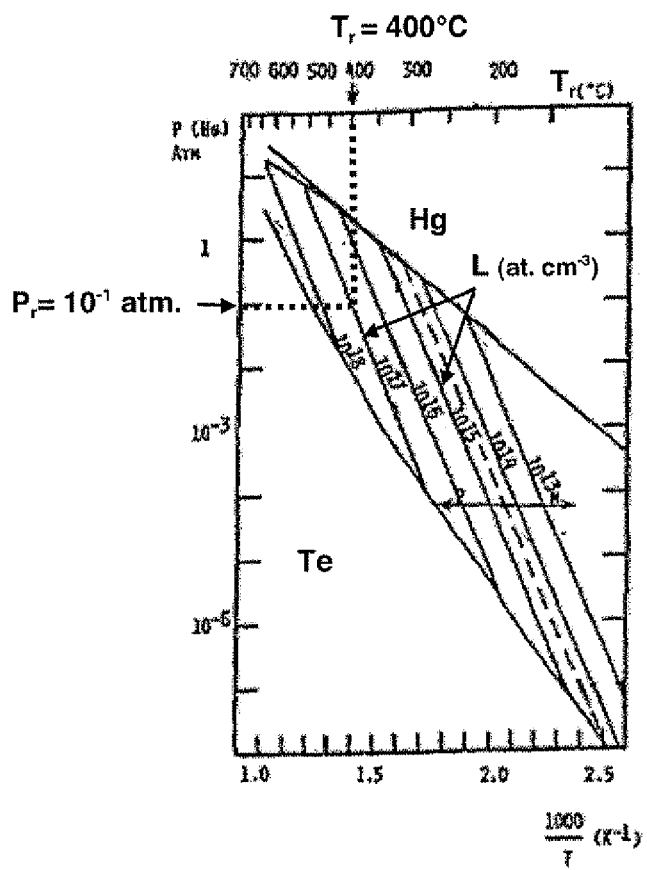
FIG. 2 represents a phase equilibrium diagram versus the partial pressure of mercury and the annealing temperature of mercury cadmium telluride of formula $Hg_{0.77}Cd_{0.23}Te$.

MCT wafer 10 is then subjected to annealing by heating at least second area 9 to annealing temperature $T_r$, higher than $T_1$. Annealing temperature $T_r$ defines annealing pressure $P_r$ in a given volume (FIG. 2). Mercury in vapor phase 5 present in second area 9 contains a number of mercury moles $n_r$ calculated according to equation (3) corresponding to the ($T_r$, $P_r$) pair.

Heating of first area 8 is interrupted during the annealing step. Advantageously, during the annealing step, first area 8 is cooled to a temperature lower than $T_1$ so as to improve the tightness of ball check valve 15. During this step, intermediate area 13 is preferably at temperature $T_1$ to prevent formation of cold spots in volume $V_2$.

Figure 8:
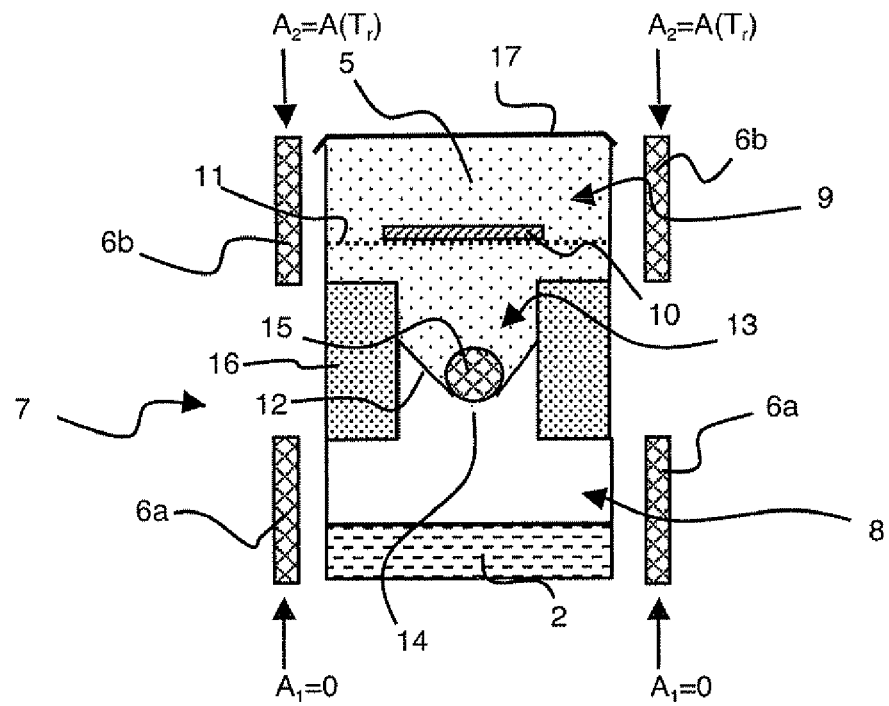

Heating to annealing temperature $T_r$, corresponding to the desired doping level is advantageously applied only to second area 9. This can be achieved by signals $A_2=A(T_r)$ and $A_1=0$. As represented in FIG. 8, pressure $P_r$ in second area 9 is then higher than that of first area 8 which cools down causing condensation of mercury in vapor phase 5 of area 8. Ball check valve 15 closed prevents mercury in vapor phase 5 from returning from second area 9 to first area 8.

Annealing temperature $T_r$ is maintained during an annealing time conventionally of several days necessary to reach the required doping rate.

According to a particular embodiment, not represented, pressure sensors are placed inside chamber 7, distributed in such a way as to be able to measure the pressure in first area 8 and in second area 9 to check that annealing pressure $P_r$ is in fact the desired pressure.

The method for annealing a semi-conductor material 10 of II-VI type in the presence of an element 2 of group II of the periodic table thus comprises the following successive steps:
   loading an excess of the element 2 of group II of the periodic table into first area 8,
   creating a vacuum in chamber 7,
   heating first and second area, respectively 8 and 9, to the same pre-determined temperature $T_1$ until pressure equilibrium between the first and second areas respectively 8 and 9 is obtained, at the saturating vapor pressure $P_{vs}$ of mercury,
   annealing semi-conductor material 10 of II-VI type by heating second area 9 to an annealing temperature $T_r$, higher than $T_1$.

For example purposes, a quartz ampoule 7 with a diameter of 10 cm presents a first area 8 with a height of 10 cm and a second area 9 with a height of 10 cm equipped with a grate 11 on which there is positioned a $Hg_{0.8}Cd_{0.2}Te$ wafer with a thickness of 10 μm for a 36 mm×38 mm surface. Ampoule 7 is filled with 5 g of liquid mercury 2 directly transferred from a conditioning ampoule. Intermediate area 13 has a reduced internal cross-section of 1.5 cm over a height of 5 cm. Quartz separating partition 12 supports quartz ball check valve 15 with a diameter of 1 cm. Ampoule 7 is cooled with liquid nitrogen and a vacuum is created until a pressure of 0.1 Pa is reached. Ampoule 7 is closed hermetically by sealing a quartz plug 18 with a blowpipe. Ampoule 7 is then placed in a two-zone furnace with a halogen lamp marketed by AET technologies and then heated with a programmed temperature gradient. First area 8 and second area 9 are first heated to a temperature $T_1$ of 241.3° C. until thermodynamic equilibrium is reached. Then second area 9 is heated to an annealing temperature $T_r$ of 400° C. during 1 day. Heating of first area 8 is interrupted during the annealing step. The charge carrier density obtained is $10^{17}$ at.cm$^{-3}$.

Adjusting the temperature of second area 9 enables annealing pressure $P_r$ to be modified without having to interrupt the heat treatment and open chamber 7. A variation of temperatures $T_1$ and/or $T_r$ results in a modification of $n_r$ and/or of pressure $P_r$ and therefore of the doping rate. Thanks to this annealing device, doping of semi-conductor materials of II-VI type can thus be performed solely from temperature control and adjustment.

The temperature can however easily be controlled and regulated during annealing, for example by thermocouple. Furthermore, the uncertainty on the temperature measurement is much lower than that on weighing of liquid mercury 2. The uncertainty on the number of moles $n_r$ is in fact calculated from the following equation (4):

$$\Delta n = n \times (\Delta T/T) \quad (4)$$

For example, for a number of moles of $1.44*10^{-3}$ mole and an annealing temperature of 673.15 K with a margin of error of <1K, the margin of error on the number of moles $\Delta n$ amounts to $10^{-5}$ mole, i.e. 0.14% against several percent in the case of weighing. The gain is therefore more than a factor 10.

The annealing device described above is efficacious and eliminates handling operations that could affect the quality of the semi-conductor materials of II-VI type doped during the heat treatment. Furthermore, unlike fabrication methods of the prior art, the annealing method according to the invention, based on control and adjustment of temperatures $T_1$ and $T_r$, is easy to implement, is flexible and guarantees control of the doping rate with an excellent reproducibility and a very low contamination rate.

The invention claimed is:

1. Chamber for annealing a semi-conductor material of II-VI type having a first area for storing an element of group II of the periodic table and a second area designed to receive the semi-conductor material of II-VI type, chamber comprising a separating partition at the level of an intermediate area, said separating partition being provided with a passage aperture equipped with a gas anti-reverse flow device to ensure one-way flow of the element of group II of the periodic table, in vapor phase, from the first area to the second area.

2. Chamber according to claim 1, wherein the gas anti-reverse flow device is formed by a check valve.

3. Chamber according to claim 2, wherein the check valve is a ball check valve.

4. Chamber according to claim 1, wherein the chamber has a reduced internal cross-section at the level of the intermediate area.

5. Chamber according to claim 1, wherein the wall of the chamber comprises a thermal insulation at the level of the intermediate area.

6. Chamber according to claim 1, wherein the chamber is made from quartz.

7. Chamber according to claim 1, wherein the chamber comprises a plugging and sealing member.

8. Chamber according to claim 1, wherein the semi-conductor material of II-VI type is mercury cadmium telluride of general formula $Hg_{1-x}Cd_xTe$ where x is comprised between 0 and 1.

9. Chamber according to claim 1, wherein the element of group II of the periodic table is mercury.

10. Device for annealing a semi-conductor material of II-VI type in the presence of an element of group II of the periodic table, comprising a chamber according to claim 1, heating means and control means enabling the heating temperature of the first area and of the second area to be controlled independently from one another.

11. Device according to claim 10, wherein the heating means and the control means of the heating temperature of the first area and of the second area, independently from one another, are formed by a two-zone furnace.

* * * * *